(12) United States Patent
Solon

(10) Patent No.: US 8,604,342 B2
(45) Date of Patent: Dec. 10, 2013

(54) LOW LEAKAGE ELECTRICAL JOINTS AND WIRE HARNESSES, AND METHOD OF MAKING THE SAME

(75) Inventor: Dean Solon, Gallatin, TN (US)

(73) Assignee: Shoals Technologies Group, LLC, Portland, TN (US)

( * ) Notice: Subject to any disclaimer, the term of this patent is extended or adjusted under 35 U.S.C. 154(b) by 458 days.

(21) Appl. No.: 12/502,395

(22) Filed: Jul. 14, 2009

(65) Prior Publication Data

US 2011/0011642 A1    Jan. 20, 2011

(51) Int. Cl.
   *H01R 4/00*      (2006.01)
   *H01R 43/00*     (2006.01)
   *H01B 7/00*      (2006.01)

(52) U.S. Cl.
   USPC ................... 174/72 A; 174/84 R; 29/868

(58) Field of Classification Search
   USPC ............................................ 174/72 A
   See application file for complete search history.

(56) References Cited

U.S. PATENT DOCUMENTS

| | | | | |
|---|---|---|---|---|
| 3,258,522 | A * | 6/1966 | Bartos et al. | 174/84 R |
| 3,852,516 | A * | 12/1974 | Vander Ploog et al. | 174/71 R |
| 3,980,374 | A * | 9/1976 | Fallot | 439/89 |
| 4,310,211 | A | 1/1982 | Bunnell et al. | |
| 4,764,123 | A | 8/1988 | Shaw et al. | 439/148 |
| 4,849,580 | A * | 7/1989 | Reuter | 174/92 |
| 4,870,878 | A | 10/1989 | Butler et al. | |
| 5,099,088 | A | 3/1992 | Usami et al. | |
| 5,226,838 | A | 7/1993 | Hsu | 39/582 |
| 5,358,588 | A * | 10/1994 | Tahara et al. | 156/49 |
| 6,359,226 | B1 * | 3/2002 | Biddell et al. | 174/74 A |
| 7,201,596 | B1 * | 4/2007 | Bukovnik et al. | 439/276 |
| 7,275,967 | B1 | 10/2007 | Olliff | 439/654 |
| 7,378,594 | B2 * | 5/2008 | Bigelow et al. | 174/84 R |
| 7,645,938 | B2 * | 1/2010 | Kogure et al. | 174/72 A |
| 8,172,938 | B2 * | 5/2012 | Alright et al. | 106/672 |
| 2005/0217888 | A1 * | 10/2005 | Arai et al. | 174/72 A |
| 2006/0049368 | A1 * | 3/2006 | Culbert | 250/503.1 |
| 2008/0011347 | A1 | 1/2008 | Aoyama et al. | |
| 2008/0289682 | A1 | 11/2008 | Adriani et al. | |
| 2009/0014055 | A1 | 1/2009 | Beck et al. | |
| 2009/0098743 | A1 | 4/2009 | Wadsworth | |
| 2010/0078058 | A1 | 4/2010 | Lee et al. | |
| 2010/0139733 | A1 | 6/2010 | Jonczyk et al. | |

OTHER PUBLICATIONS

Wind&Sun (Solar Electric Power Discussion Forum by Northern Arizona Wind & Sun) [online]. Flagstaff, AZ: "where to buy THWN-2 cable?" Oct.-Nov. 2006 [retrieved Aug. 6, 2010]. Retrieved from the Internet: <URL:http://www.wind-sun.com/ForumVB/archive/index.php?t-277.html> selected excerpts from Oct. 20, 2006, Nov. 6-7, 2006.

(Continued)

*Primary Examiner* — William H Mayo, III
*Assistant Examiner* — Hiram E Gonzalez
(74) *Attorney, Agent, or Firm* — Carla Gannon Law

(57) ABSTRACT

Low leakage electrical joints and wire harnesses for simplifying the electrical infrastructure associated with solar energy utilities are disclosed. The low leakage electrical joints include fused wires that have been sealed, encased and configured to plug into other joints to form wire harnesses. The wire harnesses are particularly well suited for coupling a plurality of solar collector junction boxes to a combiner box.

12 Claims, 9 Drawing Sheets

(56) References Cited

OTHER PUBLICATIONS

Plasti Dip Multi-Purpose Rubber Coating, Performix Handout regarding descriptions, specifications, alternative products, surface preparation, spraying, recommended equipment and settings, spraying, dipping, brushing, hints, additional application ideas, technical data sheet #5, two pages, revised Feb. 25, 2009.

Material Safety Data Sheet. Performix Brand Handout, Various sections regarding manufacturer's name, hazardous ingredients information, physical and chemical characteristics, fire and explosion hazard data, optional hazard ratings identification, reactivity and stability data, health hazard data, medical conditions generally aggravated by exposure, precautions for safe handling and use, control measures, two pages, Date Material Safety Data Sheet (MSDS) was prepared May 25, 2007.

\* cited by examiner

LOW LEAKAGE ELECTRICAL JOINTS AND WIRE HARNESSES, AND METHOD OF MAKING THE SAME

BACKGROUND (1) Field

The present invention relates generally to electrical components and, more particularly, to low leakage electrical joints and wire harnesses for simplifying the electrical infrastructure associated with solar energy utilities. The low leakage electrical joints include fused wires that have been sealed, encased and configured to plug into other joints to form wire harnesses.

(2) Related Art

The problems associated with the world's dependence on non-renewable resources have resulted in increased attention to so-called alternative energy, such as solar and wind power. As a result, small-scale production of alternative energy, for example by installing residential solar heaters or wind turbines, has become more popular. While these actions may provide psychological and possible long-term financial benefits, their actual effect on society's consumption of non-renewable resources is minimal. In short, permanent and significant changes necessitate the implementation of alternative energy generation on a large-scale utility basis.

Utility scale production of solar energy, however, is often considered financially imprudent given the high cost of materials, know-how, and labor. For example, conventionally wiring solar panels typically requires a qualified electrician to measure, cut, connect and crimp wires on site, by hand, between each individual solar panel's junction box and the combiner box, and the combiner box and master fuse box. In addition, this extensive wiring often further requires the labor and expense of troubleshooting and repairing.

In addition, conventional solar utility infrastructures often have technical shortcomings that further drive up the price. For example, conventional wire connections leak precious energy, thereby decreasing the efficiency, and increasing the price, of the system.

Accordingly, the interests of being environmentally responsible often conflict with the financial realities of building and maintaining a solar energy plant.

Thus, there remains a need for components for use in solar plants that decrease the materials, know-how and/or labor associated with building and maintaining the electrical infrastructure.

There also remains a need for components for use in solar plants that decrease the cost associated with the materials, know-how and/or labor in building and maintaining the electrical infrastructure of a solar plant.

A need also exists for components that decrease electrical leakage. Ideally, these low leakage components are relatively simple, safe and inexpensive to manufacture, transport and use.

A method of making the aforementioned components is also needed.

SUMMARY OF THE INVENTIONS

The present inventions are directed to low leakage electrical joints and wire harnesses for simplifying the electrical infrastructure associated with solar energy utilities. The low leakage electrical joints include insulated photovoltaic wire which has been partially stripped, with the portion of exposed wire welded to a portion of exposed wire on another, separate photovoltaic wire. The section encompassing the exposed wire and weld is coated in a synthetic rubber sealant and allowed to cure. After curing, the section of exposed/fused/sealed wire is encased in a molded polypropylene material including a UV stabilizing agent. These resulting joints can be shaped as T's, crosses or Y's, and be fitted with various lengths of insulated wire, female connectors and/or male connectors for attachment to at least one other joint. Wire harnesses can be assembled using a plurality of these joints, usually with lengths of insulated wire there between.

The nature of the present inventions will become apparent to those skilled in the art after reading the following description of the preferred embodiment when considered with the drawings.

DESCRIPTION OF THE PREFERRED EMBODIMENTS

Figure 1:
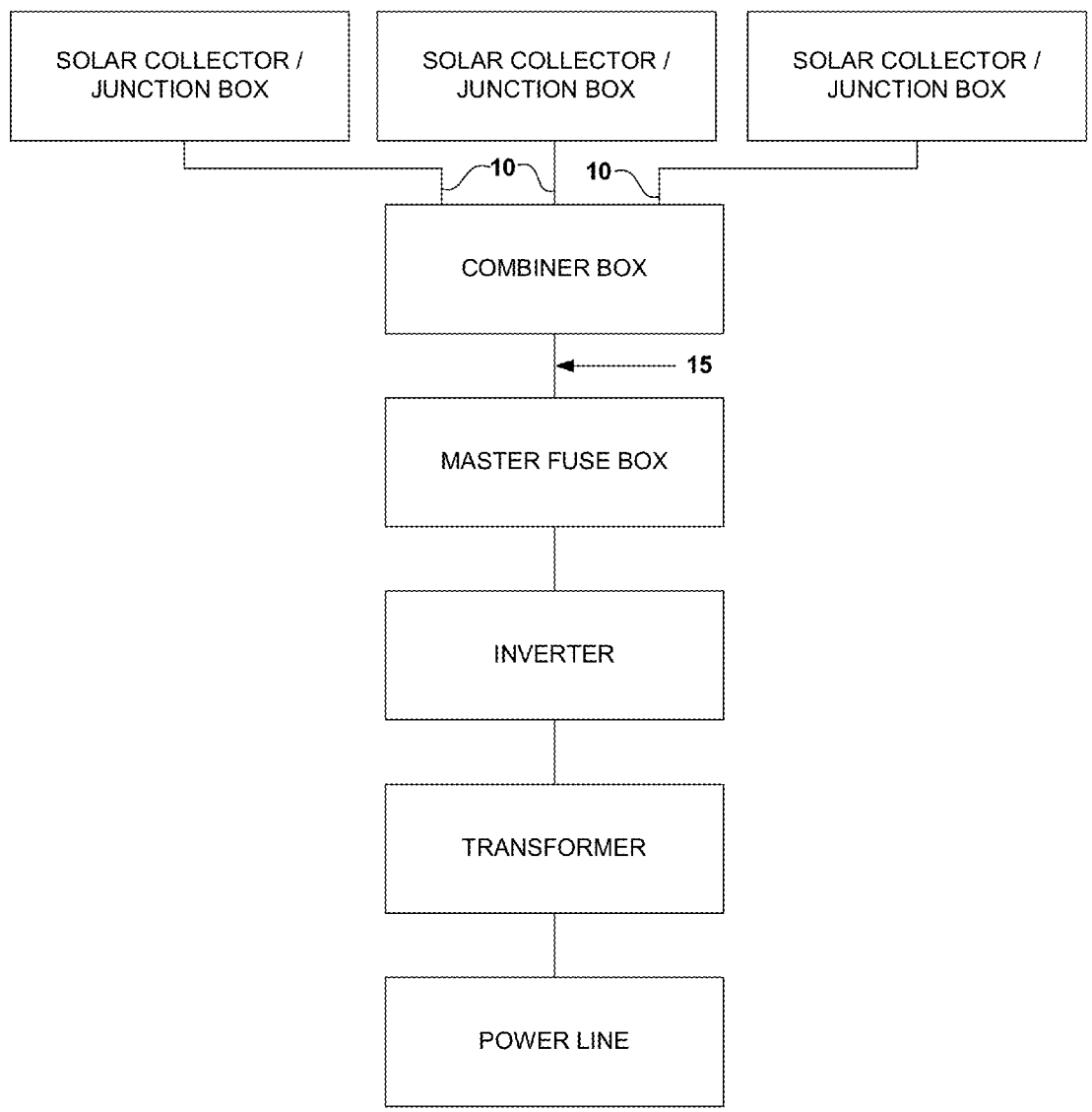
FIG. 1 schematically represents the electrical infrastructure of a solar energy system.

In the following description, like reference characters designate like or corresponding parts throughout the several views. It should be understood that the illustrations are for the purpose of describing a preferred embodiment of the inventions and are not intended to limit the inventions thereto.

FIG. 1 provides the general scheme of the electrical infrastructure of the present inventions. Each solar collector has junction box, with each junction box wired to a central combiner box via wire harness 10. The central combiner box bundles the output into trunk 15, which goes into the master fuse box. Electricity from the master fuse box travels to the inverter, then transformer, then power line.

Figure 2:
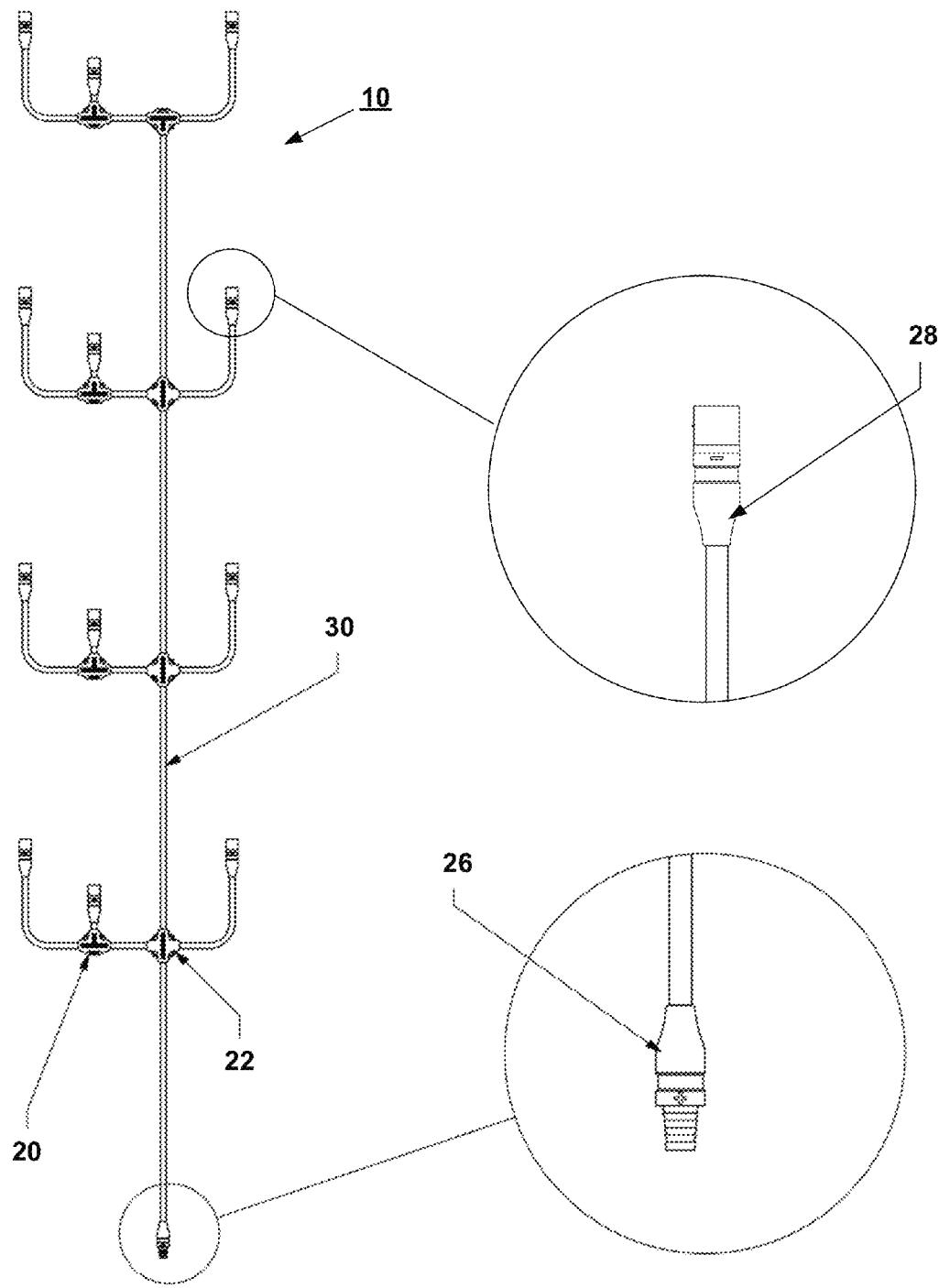
FIG. 2 illustrates a wire harness, including enlarged male and female connectors.

Referring to FIG. 2, wire harness 10 is constructed of a plurality of joints, potentially including tee joint 20, cross joint 22 and/or y joint 24 (not shown in FIG. 2). The joints are connected one to another via insulated wire 30, and include female connector 26 or male connector 28 at various junctions. It should be understood that a multitude of electrical configurations may be achieved by varying the number and choice of connectors and joint types, and that FIG. 2 merely represents the preferred configuration for coupling a plurality of junction boxes to a combiner box.

Figure 3:
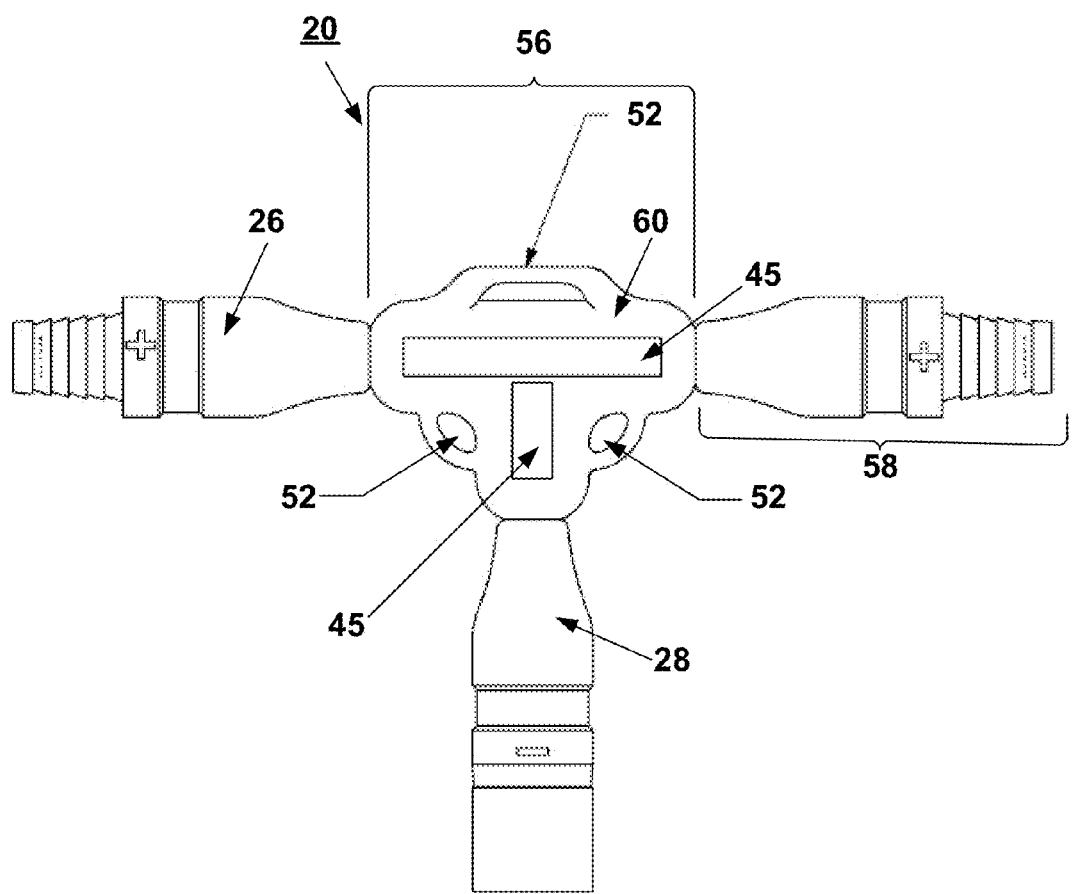
FIG. 3 is a front view of a tee joint.
Figure 4:
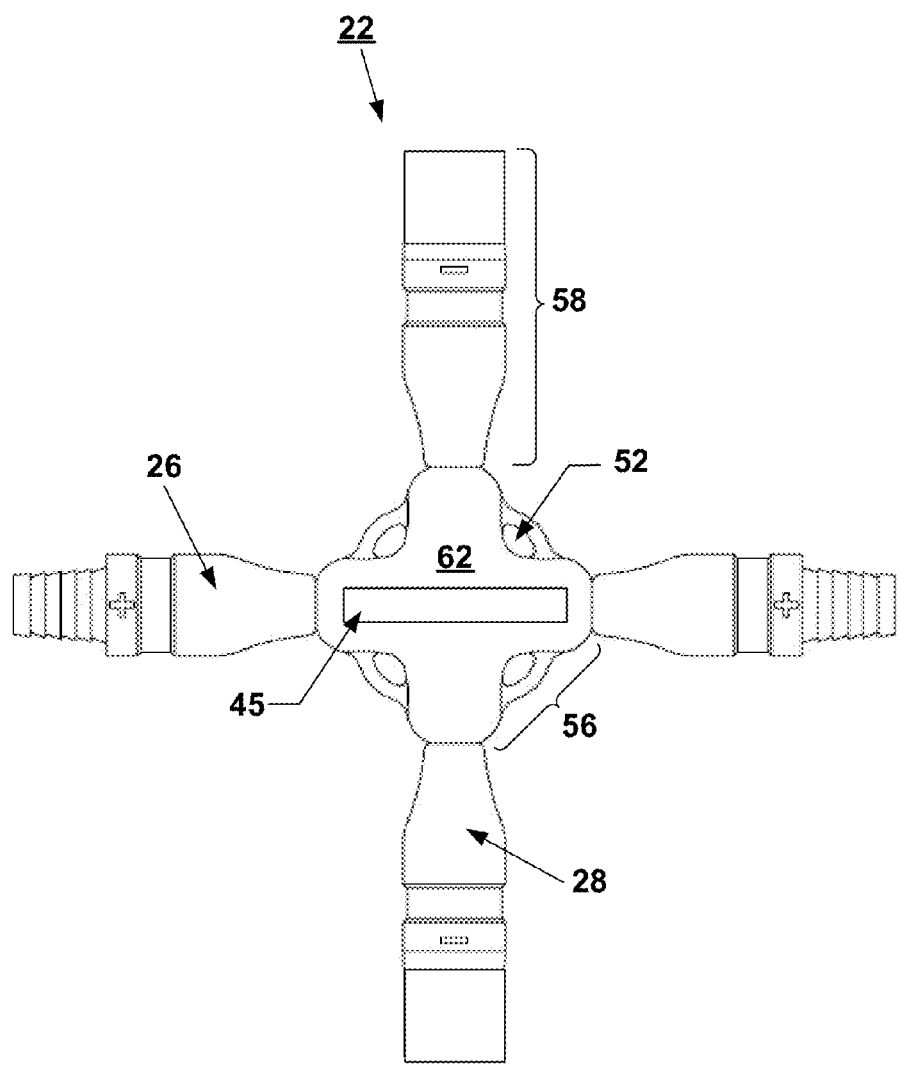
FIG. 4 is a front view of a cross joint.
Figure 5:
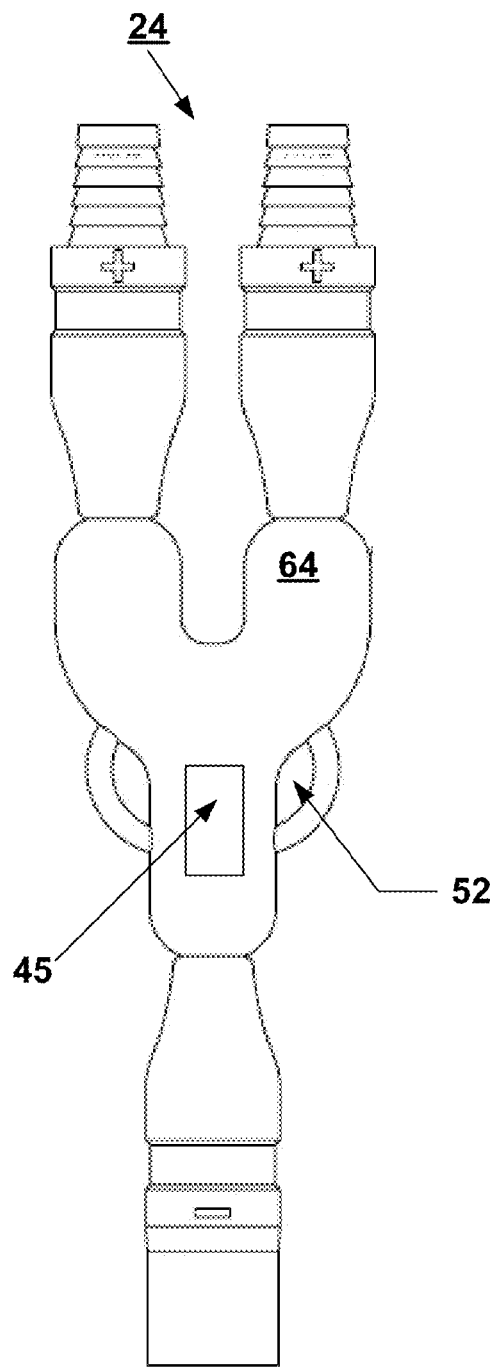
FIG. 5 is a front view of a y joint.
Figure 6:
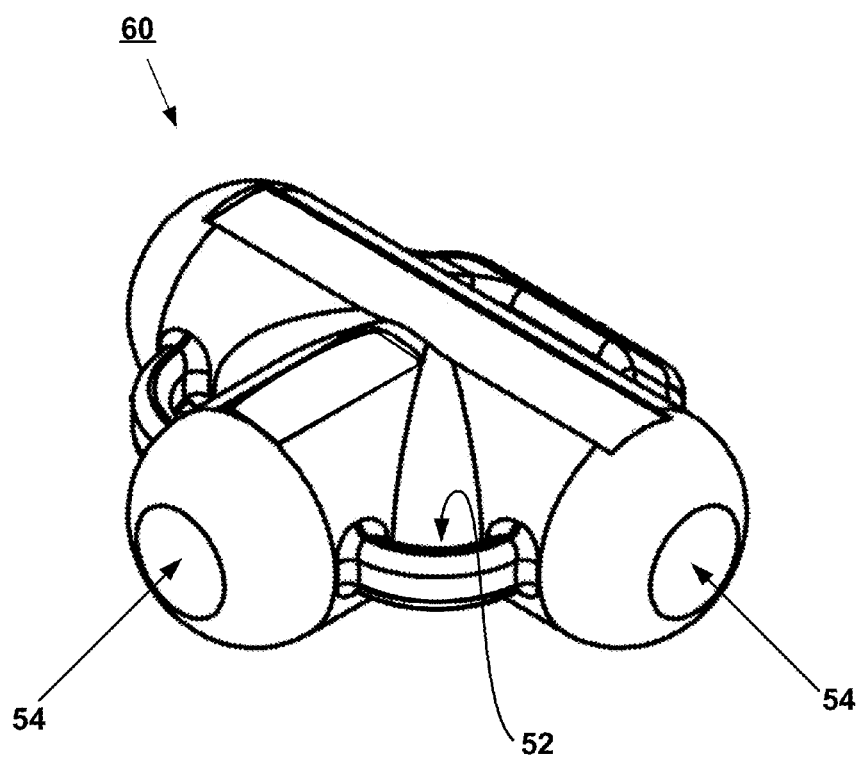
FIG. 6 is a perspective view of a tee joint encasement.
Figure 7:
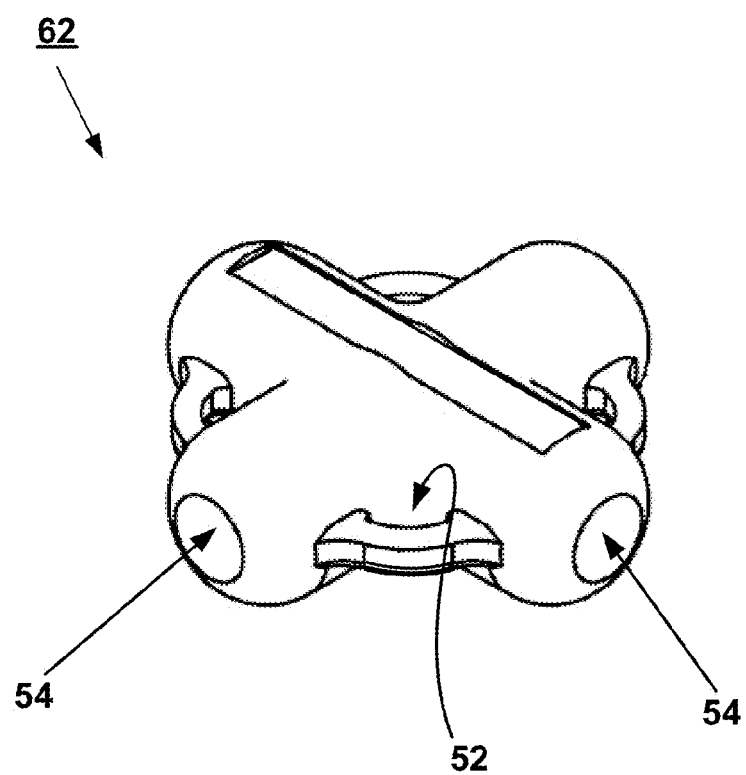
FIG. 7 is a perspective view of a cross joint encasement.
Figure 8:
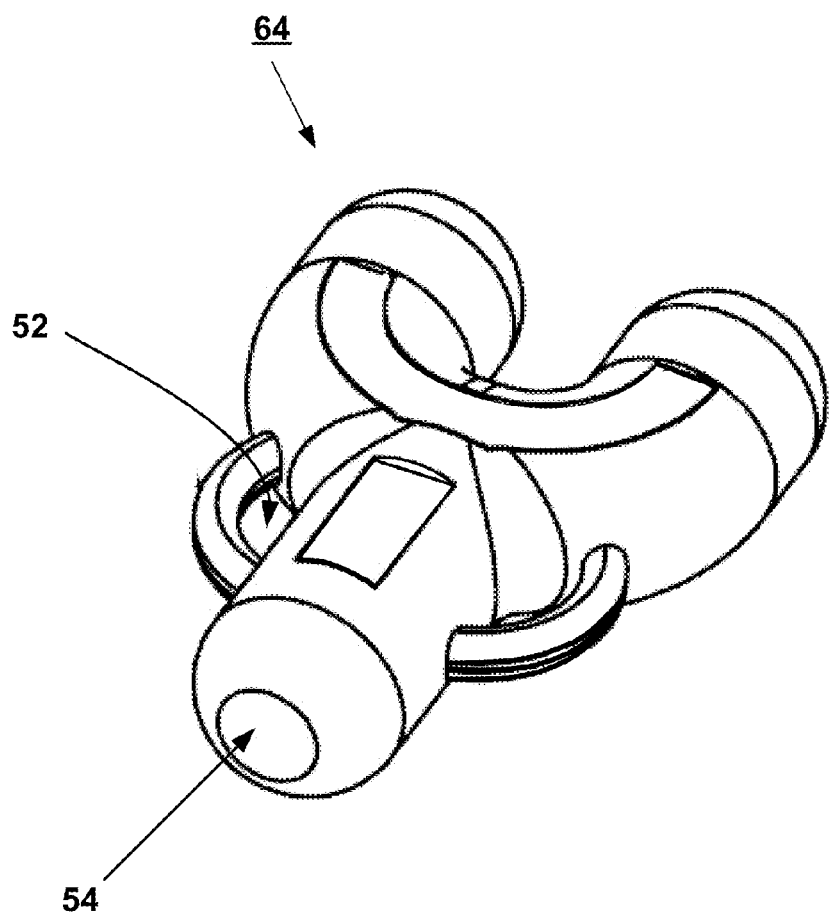
FIG. 8 is a perspective view of a y joint encasement.

Tee, cross and y joints of FIGS. 3, 4, and 5 respectively are constructed similarly with respect to each other, but vary according to shape and function. Using tee joint 20 as an example, joints comprise spokes 58 protruding from central hub 56, terminating in female connector 26 or male connector 28. Length of spokes 58 may be elongated by including longer lengths of insulated wire 30. Central hub 56 includes external tee encasement 60, which defines channels 54 (best shown in FIG. 6) through which insulated wire 30 protrudes outwardly (best shown in FIG. 2). Outwardly protruding insulated wire 30 may not be visible if connector 26, 28, which is attached to insulated wire 30, abuts channel, as shown in FIG. 3. External tee encasement 60 preferably defines securing apertures 52 through which zip ties or other fasteners may be employed to secure tee joint 20 or wire harness 10 to prevent unwanted movement during or subsequent to installation. Also, informational window 45 is preferred for displaying manufacturer, part number, technical specifications and the like.

Figure 9:
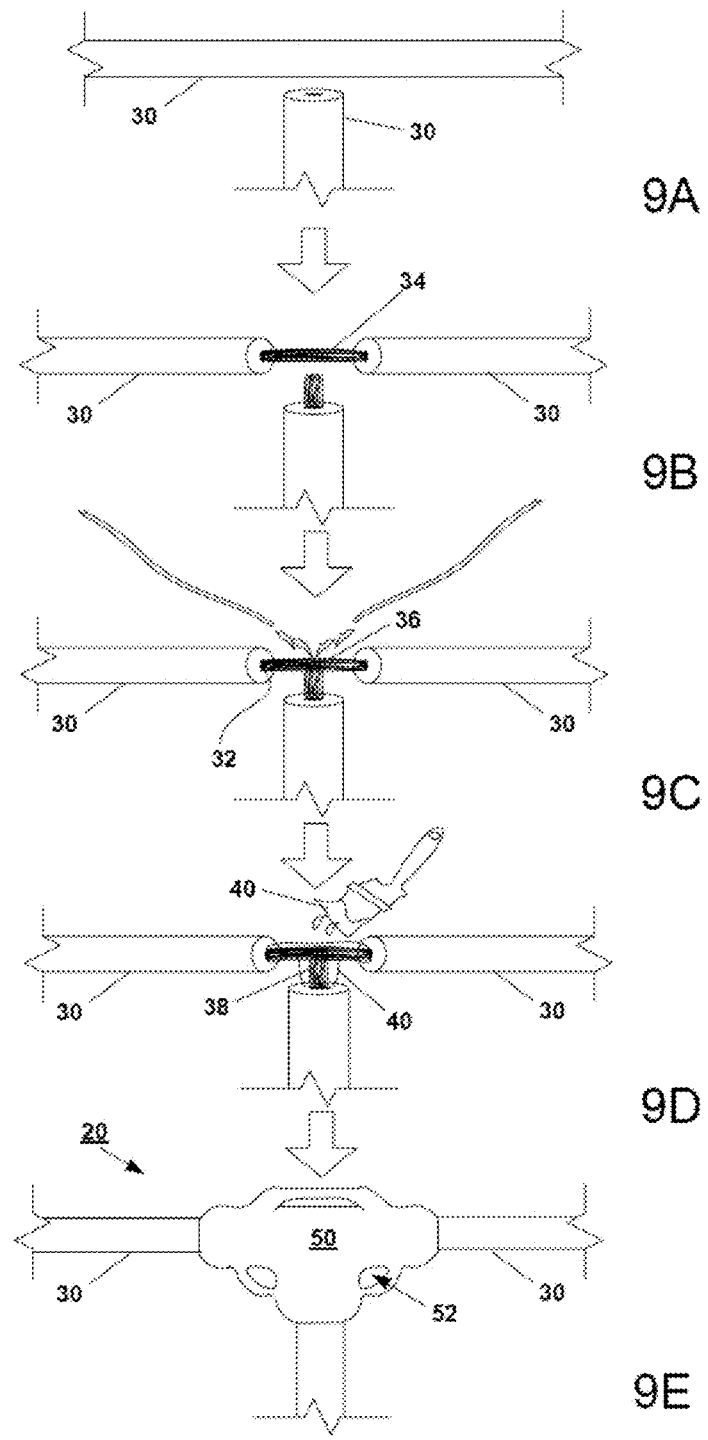
FIG. 9 depicts some steps in constructing a tee joint.

Beneath tee encasement 60 lies sealed wire 38, which collectively includes segments of exposed wire 34, portions of which are welded wire 36, covered in sealant 40. This construction is best exemplified in the scheme set forth in FIG. 9 wherein it should be understood that encasement 50 is depicted, but similar construction applies employing tee encasement 60, cross encasement 62 or y encasement 64.

Referring specifically to FIG. 9A, tee joint 20 is constructed by taking two separate insulated wires 30, and stripping off a portion of insulation 32 to reveal exposed wire 34, as shown in FIG. 9B. Preferably, the trunk wire would be window stripped to expose an internal section of wire, whereas a branch wire would be end stripped. Preferably insulated wire 30 includes copper, and most preferably is a 8, 10 or 12 AWG photovoltaic wire which is certified by UL and/or TUV for use with solar applications to carry DC current up to 1000V. A branch wire may be the next smaller size of wire as it will not carry as much current. Preferably insulation 32 is constructed of crosslinked polyolefin copolymer and is 1.7 mm thick. One preferred example of a commercially available and suitable insulated wire 30 is Betaflam Solar from Leoni Studer AG of CH-4658 Daniken, Switzerland. As shown in FIG. 9C, exposed wires are resistance welded to form welded wire 36, with the end of the branch wire preferably welded to the center of the trunk wire. Resistance welding is preferably accomplished by using two copper electrodes which pass a high current through the joint causing the wires to be fused to form a solid material at the joint.

Fused wires 36 and any remaining exposed wires 34 are completely coated with sealant 40, as shown in FIG. 9D. Preferably sealant 40 is a synthetic rubber, more preferably a silicone-based rubber sealant, with Plasti Dip® multi-purpose rubber coating from Plasti Dip International of Blaine, Minn. being the most preferred. Preferably sealant 40 is applied with a small brush, in a volume adequate to cure at a thickness of approximately 20 mils. Sealant 40 is permitted to completely cure, preferably at room temperature for approximately 4 hours. Once cured, the assembly is placed in a mold according to methods known in the art, and overmolded to form encasement 50, as shown in FIG. 9E. Encasement 50 is preferably formed using a polypropylene material, most preferably including a UV stabilization agent. The preferred polypropylene material is RTP 199 from RTP Imagineering Plastics of Winona, Minn.

Slight modifications would be necessary to form cross or y joints 22 and 24, particularly with respect to stripping and fusing wire. Moreover, additional steps would be required to secure female and male connectors 26 and 28 to segments of insulated wire 30. Namely, the wire will be cut, stripped and terminated with the applicable terminal, then a rubber boot will be installed to insulate the terminal. As assembled, all electrically live components of wire harness 10, including insulated wire 30, exposed wire 34, sealed wire 38 and connectors 26, 28 are all in electrical communication one with another.

In use, an installer would simply select the proper wire harness 10, preferably based on labeling or packaging, and connect the appropriate parts (ie female connectors 26 to junction boxes of solar collectors, and male connector 28 to combiner box). Wire harnesses of popular specifications can be manufactured in bulk, or specially assembled in advance if lesser quantities are required, or constructed on site as required by employing pre-assembled joints 20, 22, 24, connectors 26, 29 and insulated wire 30.

In addition to the novel construction and substantial savings with respect to materials, know-how and labor, the present inventions provide exceptionally low leakage compared to conventional solar connectors. Specifically, both the MC Solarline 1 connector from Multi-Contact AG of Stockbrunnenrain, Switzerland, and the Solarlok connector of Tyco Electronics in Speyer, Germany, leak 1 mA (milliamp). In contrast, tee, cross and y joints 20, 21 and 24 of the present inventions leak less than 50 nA (nanoamps). This is well below the maximum industry standard of 50 mA, as set forth by the solar industry leader.

Certain modifications and improvements will occur to those skilled in the art upon a reading of the foregoing description. It should be understood that all such modifications and improvements have been deleted herein for the sake of conciseness and readability but are properly within the scope of the following claims.

I claim:

1. A low leakage electrical joint, said joint comprising:
   a. a first exposed portion of a first insulated wire welded to a second exposed portion of a second insulated wire;
   b. cured synthetic rubber sealant directly surrounding said weld at a substantially uniform thickness of approximately 20 mils; and
   c. an overmolded polypropylene encasement surrounding said sealant, said encasement including a plurality of protrusions and having a profile selected from the group consisting of T-shaped, cross-shaped and Y-shaped, said encasement defining at least one securing aperture positioned at the vertex of two of said protrusions.

2. The joint of claim 1 wherein said first insulated wire includes copper.

3. The joint of claim 2 wherein said first insulated wire is capable of carrying DC current up to 1000V.

4. The joint of claim 1 wherein said synthetic rubber sealant is a silicone based rubber sealant.

5. The joint of claim 1 wherein said encasement includes a UV stabilization agent.

6. The joint of claim 1 wherein said at least one securing aperture is positioned within the spatial confines of said profile.

7. The joint of claim 1 wherein said encasement defines at least one channel, said first insulated wire protruding outwardly from said encasement through said channel.

8. A wire harness, said harness comprising:
   a. at least one joint comprising a first exposed portion of a first insulated wire welded to a second exposed portion of a second insulated wire; cured synthetic rubber sealant directly surrounding said weld, said sealant at a substantially uniform thickness of approximately 20 mils; and an overmolded polypropylene encasement surrounding said sealant, said encasement including a plurality of protrusions and having a profile selected from the group consisting of T-shaped, cross-shaped and Y-shaped, said encasement defining at least one securing aperture positioned at the vertex of two of said protrusions; and
   b. at least one female connector attached to said first insulated wire.

9. The wire harness of claim 8 wherein said insulated wire comprises at least one photovoltaic wire.

10. The wire harness of claim 9 wherein the gauge of said photovoltaic wire includes at least one gauge selected from the group consisting of 8, 10, and 12 AWG.

11. The wire harness of claim 8 further comprising at least one male connector in communication with said second insulated wire.

12. The joint of claim 7 wherein said encasement further defines a second channel, said second insulated wire protruding outwardly from said encasement through said second channel.

* * * * *